(12) United States Patent
Yoon et al.

(10) Patent No.: US 10,742,190 B2
(45) Date of Patent: Aug. 11, 2020

(54) PIEZOELECTRIC MICROMECHANICAL RESONATOR

(71) Applicant: SAMSUNG ELECTRONICS CO., LTD., Suwon-si (KR)

(72) Inventors: Yongseop Yoon, Seoul (KR); Sungchan Kang, Hwaseong-si (KR); Cheheung Kim, Yongin-si (KR); Sangha Park, Seoul (KR); Choongho Rhee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 721 days.

(21) Appl. No.: 15/477,203

(22) Filed: Apr. 3, 2017

(65) Prior Publication Data

US 2018/0138886 A1 May 17, 2018

(30) Foreign Application Priority Data

Nov. 11, 2016 (KR) .......................... 10-2016-0150337

(51) Int. Cl.
| | |
|---|---|
| *H01L 41/113* | (2006.01) |
| *H03H 9/02* | (2006.01) |
| *G01H 1/00* | (2006.01) |
| *G01H 11/08* | (2006.01) |
| *H01L 41/047* | (2006.01) |
| *H03H 9/17* | (2006.01) |
| *H03H 9/15* | (2006.01) |

(52) U.S. Cl.
CPC .......... *H03H 9/02244* (2013.01); *G01H 1/00* (2013.01); *G01H 11/08* (2013.01); *H01L 41/047* (2013.01); *H01L 41/0477* (2013.01); *H01L 41/1136* (2013.01); *H03H 9/17* (2013.01); *H03H 2009/155* (2013.01)

(58) Field of Classification Search
CPC ................. H03H 9/02244; H03H 9/17; H03H 2009/155; G10H 1/00; G01H 11/08; H01L 41/047; H01L 41/0477; H01L 41/1136
USPC ......................................... 310/311–371, 800
See application file for complete search history.

(56) References Cited

U.S. PATENT DOCUMENTS

| | | | |
|---|---|---|---|
| 8,169,124 B2 | 5/2012 | Lee et al. | |
| 2007/0188270 A1* | 8/2007 | Ohara .................... | H03H 9/13 333/189 |
| 2009/0026892 A1* | 1/2009 | Nakamura ............ | H01L 41/094 310/367 |

(Continued)

FOREIGN PATENT DOCUMENTS

| | | | |
|---|---|---|---|
| JP | 2006-158113 A | * 6/2006 | ............... H02N 2/00 |
| JP | 2013-175539 A | 9/2013 | |

*Primary Examiner* — Thomas M Dougherty
(74) *Attorney, Agent, or Firm* — Sughrue Mion, PLLC

(57) ABSTRACT

A piezoelectric micromechanical resonator includes a supporting beam including a fixed edge that is fixed to a supporting member and a free edge opposite the fixed edge, a piezoelectric sensor including an edge attached to the supporting member, the piezoelectric sensor further including a lower electrode, a piezoelectric unit, and an upper electrode sequentially stacked on a surface of the supporting beam, and a lumped mass provided on the surface of the supporting beam at a side of the supporting beam including the free edge, the upper electrode having a Young's modulus smaller than a Young's modulus of the lower electrode.

16 Claims, 3 Drawing Sheets

(56) References Cited

U.S. PATENT DOCUMENTS

| | | | | |
|---|---|---|---|---|
| 2009/0284102 A1* | 11/2009 | Karakaya | ................ | F16F 15/02 |
| | | | | 310/321 |
| 2013/0082569 A1* | 4/2013 | Hirabayashi | ........ | H01L 41/1136 |
| | | | | 310/319 |
| 2014/0062389 A1* | 3/2014 | Ide | .......................... | H02J 7/32 |
| | | | | 320/107 |
| 2015/0145376 A1* | 5/2015 | Sun | ........................ | H02N 2/188 |
| | | | | 310/339 |
| 2015/0244347 A1 | 8/2015 | Feng et al. | | |
| 2015/0303835 A1* | 10/2015 | Katsumura | ......... | H01L 41/1136 |
| | | | | 310/329 |
| 2018/0175274 A1* | 6/2018 | Noh | ...................... | H01L 41/042 |
| 2019/0028084 A1* | 1/2019 | Yoon | .................... | H03H 9/2405 |

* cited by examiner

PIEZOELECTRIC MICROMECHANICAL RESONATOR

CROSS-REFERENCE TO RELATED APPLICATION

This application claims priority from Korean Patent Application No. 10-2016-0150337, filed on Nov. 11, 2016, in the Korean Intellectual Property Office, the disclosure of which is incorporated herein in its entirety by reference.

BACKGROUND

1. Field

Methods and apparatuses consistent with exemplary embodiments disclosed herein relate to piezoelectric micromechanical resonators configured to have increased sensing sensitivity.

2. Description of the Related Art

A micromechanical resonator for analyzing an acoustic characteristic or a vibration characteristic frequently uses a cantilever beam. One side of the cantilever beam is configured to vibrate in a state in which the other side thereof is fixed.

A micromechanical resonator may be used for analyzing an acoustic sound or voice in mobile electronic devices or automobiles.

Also, the micromechanical resonator may be used for measuring bio information, such as heartbeats, by being attached to human skin or vibration information by being mounted on an automobile or a household appliance.

There is a need to continuously increase sensitivity of the micromechanical resonator for analyzing an acoustic characteristic or a vibration characteristic.

SUMMARY

Exemplary embodiments disclosed herein provide piezoelectric micromechanical resonators configured to increase sensing sensitivity.

According to an aspect of an exemplary embodiment, there is provided a piezoelectric micromechanical resonator including a supporting beam including a fixed edge that is fixed to a supporting member and a free edge opposite the fixed edge; a piezoelectric sensor including an edge attached to the supporting member, the piezoelectric sensor further including a lower electrode, a piezoelectric unit, and an upper electrode sequentially stacked on a surface of the supporting beam; and a lumped mass provided on the surface of the supporting beam at a side of the supporting beam including the free edge, wherein the upper electrode has a Young's modulus smaller than a Young's modulus of the lower electrode.

The lower electrode may include molybdenum and the upper electrode may include aluminum.

The upper electrode may have a thickness smaller than a thickness of the lower electrode.

The supporting beam may include a sensing region configured to sense tensile stress or compressive stress and provided under the piezoelectric sensor and a non-sensing region which is a remaining region of the supporting beam, the sensing region having a thickness smaller than a thickness of the non-sensing region.

The piezoelectric micromechanical resonator may further include a mass unit provided between the supporting beam and the lumped mass.

The mass unit may include a stack of layers having a composition which is the same as a composition of the piezoelectric sensor.

The mass unit may include a same layer as the lower electrode of the piezoelectric sensor or a stack including two layers that are the same as the lower electrode and the piezoelectric unit of the piezoelectric sensor.

The piezoelectric unit may include aluminum nitride.

According to an aspect of another exemplary embodiment, there is provided a piezoelectric micromechanical resonator including a piezoelectric sensor including a lower electrode, a piezoelectric unit, and an upper electrode sequentially stacked, and further including an edge fixed to a supporting member; a supporting beam fixed to a bottom surface of the piezoelectric sensor and spaced apart from the supporting member; and a lumped mass provided on a side of the supporting beam and spaced apart from the piezoelectric sensor.

The upper electrode may have a Young's modulus smaller than a Young's modulus of the lower electrode.

The lower electrode may include molybdenum and the upper electrode may include aluminum.

The upper electrode may have a thickness smaller than a thickness of the lower electrode.

The piezoelectric micromechanical resonator may further include a mass unit provided between the supporting beam and the lumped mass.

The mass unit may include a stack of layers having a composition that is the same as a composition of the piezoelectric sensor.

The mass unit may include the same layer as the lower electrode of the piezoelectric sensor or a stack including two layers that are the same as the lower electrode and the piezoelectric unit of the piezoelectric sensor.

The piezoelectric unit may include aluminum nitride.

Additional aspects will be set forth in part in the description which follows and, in part, will be apparent from the description, or may be learned by practice of the presented exemplary embodiments.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
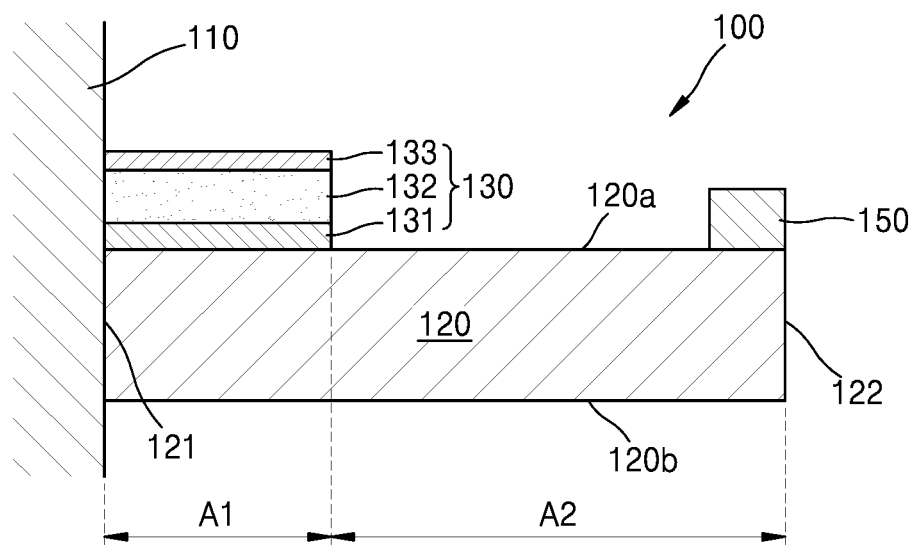
FIG. 1 is a schematic cross-sectional view showing a structure of a piezoelectric micromechanical resonator according to an exemplary embodiment.

Reference will now be made in detail to exemplary embodiments, examples of which are illustrated in the accompanying drawings. In the drawings, thicknesses of layers and regions may be exaggerated or reduced for convenience of explanation. The exemplary embodiments are capable of various modifications and may be embodied in many different forms.

It will also be understood that when an element is referred to as being "on" or "above" another element, the element may be in direct contact with the other element or other intervening elements may be present.

FIG. 1 is a schematic cross-sectional view showing a structure of a piezoelectric micromechanical resonator 100 according to an exemplary embodiment.

Referring to FIG. 1, the piezoelectric micromechanical resonator 100 may have a cantilever structure. The piezoelectric micromechanical resonator 100 includes a supporting beam 120 having a fixed edge 121 fixed on a supporting member 110 and a free edge 122 opposite to the fixed edge 121.

The supporting member 110 may be a part of a mobile electronic device, for example, a mobile phone or an automobile.

The supporting beam 120 may be a plate. The supporting beam 120 may have a thickness of approximately 1 μm. The supporting beam 120 may have a width in a range from about a few tens of μm to about a few hundreds of μm. The supporting beam 120 may include silicon that is generally used in semiconductor processes. However, the exemplary embodiments are not limited thereto. The supporting beam 120 may include glass, silicon oxide, or silicon nitride.

A piezoelectric sensor 130 may be installed on a side of a first surface 120a of the supporting beam 120 and a lumped mass 150 may be arranged on the other side of the first surface 120a of the supporting beam 120. The supporting beam 120 may include a sensing region A1 on which the piezoelectric sensor 130 is arranged and a non-sensing region A2 which is a remaining region of the supporting beam 120.

The piezoelectric sensor 130 and the lumped mass 150 may be spaced apart from each other on the first surface 120a of the supporting beam 120. In the current exemplary embodiment, the piezoelectric sensor 130 and the lumped mass 150 are arranged on the first surface 120a of the supporting beam 120. However, the exemplary embodiments are not limited thereto. For example, the piezoelectric sensor 130 may be arranged on the first surface 120a of the supporting beam 120 and the lumped mass 150 may be arranged on a second surface 120b of the supporting beam 120.

The piezoelectric sensor 130 may include a lower electrode 131, a piezoelectric unit 132, and an upper electrode 133 that are sequentially formed in the stated order on the supporting beam 120. An edge of the piezoelectric sensor 130 may be fixed on the supporting member 110. The lower electrode 131, the piezoelectric unit 132, and the upper electrode 133 respectively may be formed to a thickness in a range from about 0.1 μm to about 0.3 μm.

The piezoelectric unit 132 may include aluminum nitride or lead zirconate titanate (PZT).

The lower electrode 131 may include molybdenum so that the crystallinity of the piezoelectric unit 132, for example, aluminum nitride, is well formed when the aluminum nitride is deposited on the lower electrode 131. However, the exemplary embodiments are not limited thereto. For example, the lower electrode 131 may include platinum.

The upper electrode 133 may include a conductive material having a Young's modulus smaller than that of molybdenum. For example, the upper electrode 133 may include aluminum, copper, or titanium. Also, the upper electrode 133 may have a thickness smaller than that of the lower electrode 131, although is not limited thereto, and may also have a thickness that is equal to or greater than the lower electrode 131.

The lumped mass 150 increases an inertia force of the piezoelectric micromechanical resonator 100 when an external force, such as sound or vibration, is applied to a dynamic behavior of the supporting beam 120. The lumped mass 150 may include steel or tungsten.

Hereinafter, an operation of the piezoelectric micromechanical resonator 100 according to an exemplary embodiment will be described.

Figure 2:
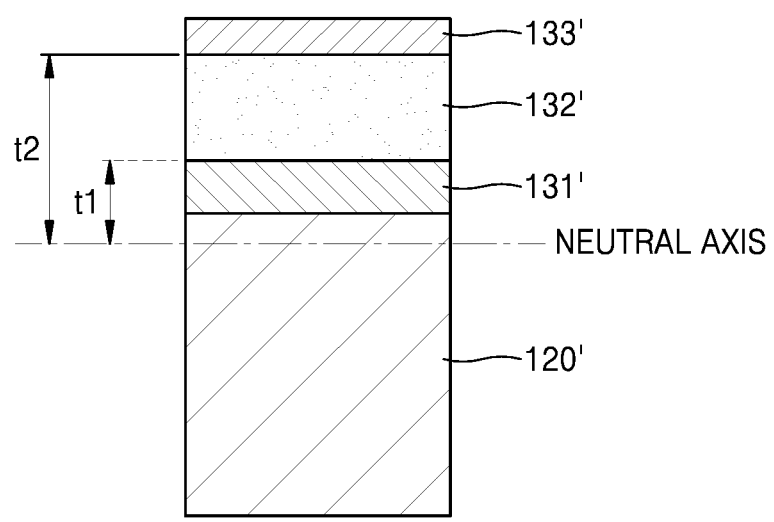
FIG. 2 is a cross-sectional view of a sensing stack which is a part of a sensing region of FIG. 1.

FIG. 2 is a cross-sectional view of a sensing stack which is a part of a sensing region of FIG. 1. The sensing stack includes a supporting beam layer 120', a lower electrode layer 131', a piezoelectric unit layer 132', and an upper electrode layer 133'. A thickness t1 indicates a height from a neutral axis to an upper surface of the lower electrode 131, and a thickness t2 indicates a height from the neutral axis to a lower surface of the upper electrode 133. The neutral axis is a region where strain is zero when the supporting beam 120 bends. There is no strain or stress at the neutral axis. In FIG. 1, when the fixed edge 121 is fixed and a force is downwardly applied to the free edge 122, tensile stress is generated on an upper side of the neutral axis in the sensing stack, and compressive stress is generated on a lower side of the neutral axis in the sensing stack. Also, in FIG. 1, when the fixed edge 121 is fixed and a force is upwardly applied to the free edge 122, compressive stress is generated on an upper side of the neutral axis in the sensing stack, and tensile stress is generated on a lower side of the neutral axis in the sensing stack. At this point, strain is not generated on the neutral axis.

As shown in FIG. 1, in a cantilever beam structure having the lumped mass 150, when an external force (for example, a sound or vibration) is applied to the beam structure, an inertial force Mx" is generated according to a behavior of the lumped mass 150. When a resonance frequency of the supporting beam 120 and a frequency of an external force are coincident to each other, a resonance is generated, and at this time, a largest inertial force is generated. The inertial force generates a bending moment on the piezoelectric sensor 130 in proportion to a distance between the piezoelectric sensor 130 and the lumped mass 150, and the bending moment causes stress on the lower electrode 131, the piezoelectric unit 132, and the upper electrode 133 of the piezoelectric sensor 130. With the neutral axis as a center, one side receives tensile stress and the other side receives compressive stress. At this point, the stress generated at the piezoelectric unit 132 generates charge in response to the magnitude of the stress, and generates a voltage in reverse proportion to a capacitance between the upper electrode 133 and the lower electrode 131 as expressed by Equation 1 below.

$$V = Q/C \qquad \text{Equation 1}$$

Here, Q indicates charge, C indicates capacitance, and V indicates a generated voltage.

If Equation 1 is expressed as functions of an inertial force of the lumped mass 150 applied to the piezoelectric sensor 130 and mechanical properties and physical dimensions of layers of the piezoelectric sensor 130, it may be expressed as Equation 2.

$$V = \frac{Q}{C} = \frac{d_{31}E_3Mx''L_b}{2\epsilon(EI)_{overall}}[t_2^2 - t_1^2] \quad \text{Equation 2}$$

Here, M indicates a weight of a lumped mass, x" indicates an acceleration of the lumped mass, $d_{31}$ indicates a piezoelectric constant of a piezoelectric unit, ε indicates a dielectric constant, $E_i$ indicates a Young's modulus of $i_{th}$ layer, $I_i$ indicates a moment of inertia of an area of an $i_{th}$ layer, t1 indicates a height from a neutral axis of a sensing stack to a lower electrode of a piezoelectric sensor, and t2 indicates a height from the neutral axis of the sensing stack to a piezoelectric unit.

$E_3$ indicates a Young's modulus of the piezoelectric unit, and $(EI)_{overall} = E_1I_1 + E_2I_2 + E_3I_3 + E_4I_4$. Here, the $i_{th}$ layer indicates first through fourth layers in the order of the supporting beam 120, the lower electrode 131, the piezoelectric unit 132, and the upper electrode 133.

In order to increase a sensitivity of the piezoelectric sensor 130, a generated voltage V should be increased, and to do this, it may be necessary to reduce the $(EI)_{overall}$ or to increase an acceleration of the lumped mass when considering Equation 2.

In order to reduce the $(EI)_{overall}$, it may be necessary to form the upper electrode 133 by using a conductive material having a Young's modulus smaller than that of a material used to form the lower electrode 131 (E4 is smaller than E2) or the thickness of the upper electrode 133 is formed to be smaller than that of the lower electrode 131 (I4 is smaller than I2).

Figure 3:
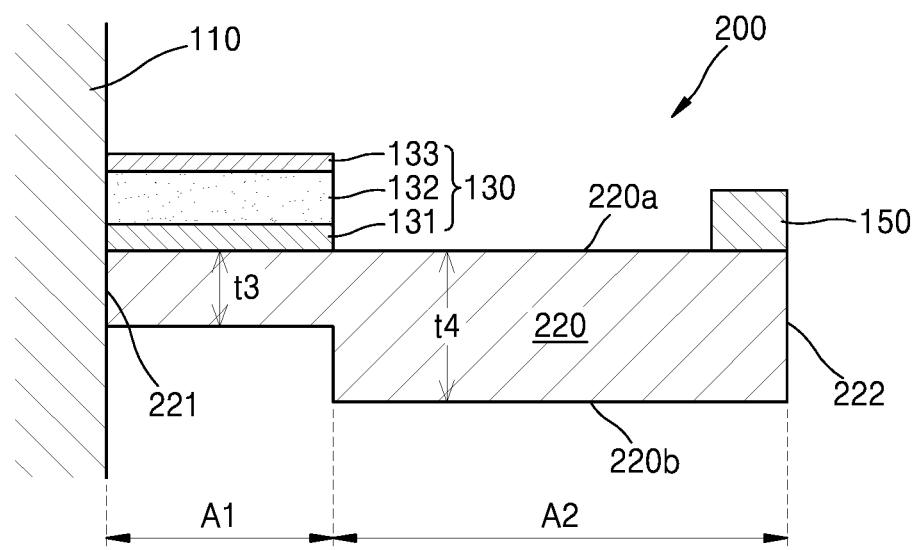
FIG. 3 is a schematic cross-sectional view showing a structure of a piezoelectric micromechanical resonator according to another exemplary embodiment.

FIG. 3 is a schematic cross-sectional view showing a structure of a piezoelectric micromechanical resonator 200 according to another exemplary embodiment. Like reference numerals are used to indicate elements that are substantially identical to the elements of FIG. 1, and the descriptions thereof will not be repeated.

Referring to FIG. 3, the piezoelectric micromechanical resonator 200 may have a cantilever structure. The piezoelectric micromechanical resonator 200 includes a supporting beam 220 having a fixed edge 221 fixed on a supporting member 110 and a free edge 222.

The supporting member 110 may be a part of a mobile electronic device, for example, a mobile phone or an automobile.

The supporting beam 220 may be a plate. The supporting beam 220 may have a thickness of approximately 1 μm. A length of the supporting beam 220 may be greater than the thickness thereof. The supporting beam 220 may include silicon that is used in semiconductor processes. However, the exemplary embodiments are not limited thereto, that is, the supporting beam 220 may include glass, silicon oxide, or silicon nitride.

A piezoelectric sensor 130 may be installed on a side of a first surface 220a of the supporting beam 220 and a lumped mass 150 may be arranged on the other side of the first surface 220a of the supporting beam 220. The supporting beam 220 may include a sensing region A1 on which the piezoelectric sensor 130 is arranged and a non-sensing region A2 which is a remaining region of the supporting beam 220.

A thickness of the sensing region A1 of the supporting beam 220 may be smaller than a thickness of the non-sensing region A2. For example, the non-sensing region A2 of the supporting beam 220 may have a thickness of 1 μm, and the sensing region A1 of the supporting beam 220 may have a thickness in a range from 0.1 μm to 0.6 μm. If the sensing region A1 of the supporting beam 220 has a relatively small thickness, a value of $E_1I_1$ in Equation 2 is reduced, and accordingly, the detection sensitivity of the piezoelectric sensor 130 is increased.

In the current exemplary embodiment, the sensing region A1 of the supporting beam 220 has a thinner thickness by etching the sensing region A1 of the supporting beam 220 from a second surface 220b of the supporting beam 220. However, the exemplary embodiments are not limited thereto. For example, the thickness of the sensing region A1 of the supporting beam 220 may be reduced by etching the sensing region A1 from the first surface 220a of the supporting beam 220. Also, the thickness of the sensing region A1 may be reduced by etching both the first surface 220a and the second surface 220b of the supporting beam 220.

Figure 4:
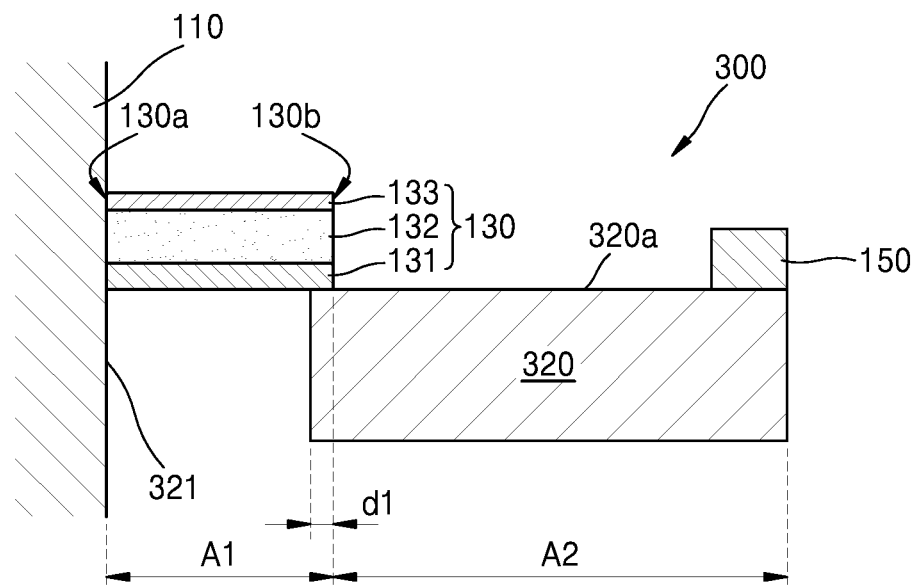
FIG. 4 is a schematic cross-sectional view showing a structure of a piezoelectric micromechanical resonator according to another exemplary embodiment.

FIG. 4 is a schematic cross-sectional view showing a structure of a piezoelectric micromechanical resonator 300 according to another exemplary embodiment. Like reference numerals are used to indicate elements that are substantially identical to the elements of FIG. 1, and the descriptions thereof will not be repeated.

Referring to FIG. 4, the piezoelectric micromechanical resonator 300 may have a cantilever structure. The piezoelectric micromechanical resonator 300 includes a piezoelectric sensor 130, an edge of which is fixed on a supporting member 110. An edge of an upper surface 320a of a supporting beam 320 is fixed on a lower side of the other edge of the piezoelectric sensor 130. The other edge of the supporting beam 320 is not fixed.

The supporting member 110 may be a part of a mobile electronic device, for example, a mobile phone or an automobile.

The supporting beam 320 may be a plate. The supporting beam 320 may have a thickness of approximately 1 μm. Also, a length of the supporting beam 320 may be greater than the thickness thereof. The supporting beam 320 may include silicon that is used in semiconductor processes. However, the exemplary embodiments are not limited thereto. That is, the supporting beam 320 may include glass, silicon oxide, or silicon nitride.

A part of the piezoelectric sensor 130 may be connected to the edge of the first surface 320a of the supporting beam 320, and a lumped mass 150 may be arranged on the other edge of the first surface 320a of the supporting beam 320. The piezoelectric micromechanical resonator 300 includes a sensing region A1 on which the piezoelectric sensor 130 is arranged and a non-sensing region A2 which is a remaining region of the piezoelectric micromechanical resonator 300. The sensing region A1 may be the same region as a region of the piezoelectric sensor 130. A length dl of the supporting beam 320 in the sensing region A1 may be formed by etching the supporting beam 320 in the sensing region A1. Accordingly, a majority of the supporting beam 320 in the sensing region A1 is removed, and a remaining part of the supporting beam 320 in the sensing region A1 is fixed on the piezoelectric sensor 130. Since a length of the supporting beam 320 in the sensing region A1 is small, the value of $E_1I_1$ in Equation 2 is reduced, and accordingly, the detection sensitivity of the piezoelectric sensor 130 is increased.

Figure 5:
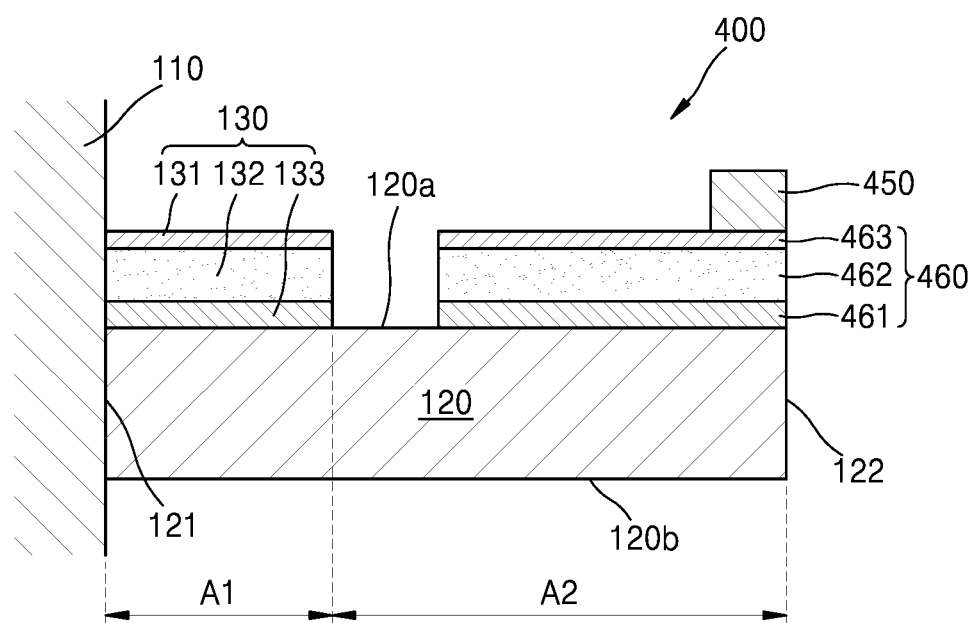
FIG. 5 is a schematic cross-sectional view showing a structure of a piezoelectric micromechanical resonator according to another exemplary embodiment.

FIG. 5 is a schematic cross-sectional view showing a structure of a piezoelectric micromechanical resonator 400 according to another exemplary embodiment. Like reference numerals are used to indicate elements that are substantially identical to the elements of FIG. 1, and the descriptions thereof will not be repeated.

Referring to FIG. 5, the piezoelectric micromechanical resonator 400 may have a cantilever structure. The piezoelectric micromechanical resonator 200 includes a supporting beam 120 having a fixed edge 121 fixed on a supporting member 110 and a free edge 122.

The supporting member 110 may be a part of a mobile electronic device, for example, a mobile phone or an automobile.

The supporting beam 120 may be a plate. The supporting beam 120 may have a thickness of approximately 1 µm. A length of the supporting beam 120 may be greater than the thickness thereof. The supporting beam 120 may include silicon that is used in semiconductor processes. However, the example embodiments are not limited thereto, that is, the supporting beam 120 may include glass, silicon oxide, or silicon nitride.

A piezoelectric sensor 130 is installed on a side of a first surface 120a of the supporting beam 120 and a mass unit and a lumped mass 450 may sequentially formed on the other side of the first surface 120a of the supporting beam 120. The mass unit may be a piezoelectric stack 460 including a lower electrode layer 461, a piezoelectric unit layer 462, and an upper electrode layer 463. The piezoelectric sensor 130 and the piezoelectric stack 460 may be spaced apart by a predetermined gap. The piezoelectric sensor 130 and the piezoelectric stack 460 may be formed such that, after the piezoelectric sensor 130 and the piezoelectric stack 460 are formed as the same layer, a region of the same layer between the piezoelectric sensor 130 and the piezoelectric stack 460 may be etched so that the piezoelectric sensor 130 and the piezoelectric stack 460 are spaced apart from each other.

The supporting beam 120 includes a sensing region A1 on which the piezoelectric sensor 130 is arranged and a non-sensing region A2 which is a remaining region of the supporting beam 120.

The piezoelectric stack 460 may be formed together with the lower electrode layer 131, the piezoelectric unit layer 132, and the upper electrode layer 133 of the piezoelectric sensor 130 on the first surface 120a of the supporting beam 120. The lower electrode layer 461, the piezoelectric unit layer 462, and the upper electrode layer 463 of the piezoelectric stack 460 respectively may include the same materials and have the same heights as the lower electrode layer 131, a piezoelectric unit layer 132, and an upper electrode layer 133 of the piezoelectric sensor 130.

An equation of motion of a cantilever having a lumped mass may be expressed as Equation 3.

$$Mx''+cx'+kx=F_{eq} \sin \omega t \quad \text{Equation 3}$$

Here, c indicates a damping coefficient, k indicates a rigidity of a supporting beam, and $F_{eq}$ indicates an external force.

Referring to Equation 3, acceleration $X''$ of a lumped mass increases according to the increase in rigidity k of a supporting beam. When the thickness of a supporting beam is increased, the rigidity of the supporting beam is increased, and thus, the sensing sensitivity may be increased by forming the structure of a non-sensing region of the supporting beam as the same as the stack structure of a piezoelectric sensor.

The piezoelectric stack 460 increases the rigidity of the supporting beam 120 in the non-sensing region, and accordingly, acceleration $X''$ of Equation 2 is increased. As a result, a detection voltage V is increased, and thus, the sensing sensitivity of the piezoelectric micromechanical resonator 400 is increased.

In FIG. 5, the piezoelectric stack 460 and the piezoelectric sensor 130 have the same configuration as each other, but the exemplary embodiments are not limited thereto. For example, the upper electrode layer 463 or the upper electrode layer 463 and the piezoelectric unit layer 462 may not be formed in the piezoelectric stack 460. Also, the piezoelectric stack 460 may include a different material from the piezoelectric sensor 130.

In FIG. 5, the lumped mass 150 is arranged on a piezoelectric stack, but the exemplary embodiments are not limited thereto. For example, the lumped mass 150 may be arranged on the second surface 120b of the supporting beam 120.

In the piezoelectric micromechanical resonator according to the example embodiments, the sensing sensitivity of a vibration may be increased by changing the structure of the supporting beam that supports the piezoelectric sensing unit or the Young's modulus of the upper electrode.

While one or more exemplary embodiments have been described with reference to the figures, it will be understood by those of ordinary skill in the art that various changes in form and details may be made therein without departing from the spirit and scope as defined by the following claims.

What is claimed is:

1. A piezoelectric micromechanical resonator comprising:
   a supporting beam comprising a fixed edge that is fixed to a supporting member and a free edge opposite the fixed edge;
   a piezoelectric sensor comprising an edge attached to the supporting member, the piezoelectric sensor further comprising a lower electrode, a piezoelectric unit, and an upper electrode sequentially stacked on a surface of the supporting beam; and
   a lumped mass provided on the surface of the supporting beam at a side of the supporting beam comprising the free edge,
   wherein the upper electrode has a Young's modulus smaller than a Young's modulus of the lower electrode.

2. The piezoelectric micromechanical resonator of claim 1, wherein the lower electrode comprises molybdenum and the upper electrode comprises aluminum.

3. The piezoelectric micromechanical resonator of claim 1, wherein the upper electrode has a thickness smaller than a thickness of the lower electrode.

4. The piezoelectric micromechanical resonator of claim 1, wherein the supporting beam comprises a sensing region configured to sense tensile stress or compressive stress and provided under the piezoelectric sensor and a non-sensing region which is a remaining region of the supporting beam, the sensing region having a thickness smaller than a thickness of the non-sensing region.

5. The piezoelectric micromechanical resonator of claim 1, further comprising a mass unit provided between the supporting beam and the lumped mass.

6. The piezoelectric micromechanical resonator of claim 5, wherein the mass unit comprises a stack of layers having a composition which is the same as a composition of the piezoelectric sensor.

7. The piezoelectric micromechanical resonator of claim 5, wherein the mass unit comprises a same layer as the lower electrode of the piezoelectric sensor or a stack including two layers that are the same as the lower electrode and the piezoelectric unit of the piezoelectric sensor.

8. The piezoelectric micromechanical resonator of claim 1, wherein the piezoelectric unit comprises aluminum nitride.

9. A piezoelectric micromechanical resonator comprising:
a piezoelectric sensor comprising a lower electrode, a piezoelectric unit, and an upper electrode sequentially stacked, and further comprising an edge fixed to a supporting member;
a supporting beam fixed to a bottom surface of the piezoelectric sensor and spaced apart from the supporting member; and
a lumped mass provided on a side of the supporting beam and spaced apart from the piezoelectric sensor.

10. The piezoelectric micromechanical resonator of claim 9, wherein the upper electrode has a Young's modulus smaller than a Young's modulus of the lower electrode.

11. The piezoelectric micromechanical resonator of claim 10, wherein the lower electrode comprises molybdenum and the upper electrode comprises aluminum.

12. The piezoelectric micromechanical resonator of claim 9, wherein the upper electrode has a thickness smaller than a thickness of the lower electrode.

13. The piezoelectric micromechanical resonator of claim 9, further comprising a mass unit provided between the supporting beam and the lumped mass.

14. The piezoelectric micromechanical resonator of claim 13, wherein the mass unit comprises a stack of layers having a composition that is the same as a composition of the piezoelectric sensor.

15. The piezoelectric micromechanical resonator of claim 13, wherein the mass unit comprises the same layer as the lower electrode of the piezoelectric sensor or a stack including two layers that are the same as the lower electrode and the piezoelectric unit of the piezoelectric sensor.

16. The piezoelectric micromechanical resonator of claim 9, wherein the piezoelectric unit comprises aluminum nitride.

* * * * *